United States Patent [19]
Xing et al.

[11] Patent Number: 6,090,697
[45] Date of Patent: Jul. 18, 2000

[54] ETCHSTOP FOR INTEGRATED CIRCUITS

[75] Inventors: Guoqiang Xing, Dallas; Glenn A. Cerny, Allen; Mark R. Visokay, Dallas, all of Tex.

[73] Assignee: Texas Instruments Incorporated, Dallas, Tex.

[21] Appl. No.: 09/105,411

[22] Filed: Jun. 26, 1998

Related U.S. Application Data
[60] Provisional application No. 60/051,258, Jun. 30, 1997.

[51] Int. Cl.[7] .................................................. H01L 21/4763
[52] U.S. Cl. .......................... 438/618; 438/643; 437/195; 156/643
[58] Field of Search ........................... 156/643; 438/618; 437/195

[56] References Cited

U.S. PATENT DOCUMENTS

| | | | |
|---|---|---|---|
| 4,069,096 | 1/1978 | Reinberg | 156/643 |
| 4,582,564 | 4/1986 | Shanefield et al. | 156/643 |
| 5,231,306 | 7/1993 | Meikle et al. | 257/751 |
| 5,360,995 | 11/1994 | Graas | 257/751 |
| 5,504,041 | 4/1996 | Summerfelt | 437/235 |
| 5,609,927 | 3/1997 | Summerfelt et al. | 427/553 |

*Primary Examiner*—Richard Elms
*Assistant Examiner*—Pho Luu
*Attorney, Agent, or Firm*—Carlton H. Hoel; W. James Brady; Frederick J. Telecky, Jr.

[57] ABSTRACT

A high-selectivity via etching process. The process includes the steps of: forming an etchstop layer 840 of a material selected from the group consisting of Ti—Al, Ti—Al—N, Ta—Al, Al—N, Ti—Al/Ti—N, Ti—Al—N/Ti—N, Ta—Al/ Ti—N, and Ti—Al/Ti—Al—N; forming a dielectric layer over the etchstop layer; and etching the dielectric layer with a fluorine-bearing etchant.

16 Claims, 12 Drawing Sheets

ETCHSTOP FOR INTEGRATED CIRCUITS

This application claims priority under 35 USC § 119(e)(1) of provisional application Ser. No. 60/051,258, filed Jun. 30, 1997.

FIELD OF THE INVENTION

This invention relates to electronic devices, and more specifically to semiconductor integrated circuit capacitors and methods of fabrication.

BACKGROUND OF THE INVENTION

Increasing demand for semiconductor memory and competitive pressures require higher density integrated circuit dynamic random access memories (DRAMs) based on one-transistor, one-capacitor memory cells. But scaling down capacitors with the standard silicon oxide and nitride dielectric presents problems including decreasing the quantity of charge that may be stored in a cell. Consequently, alternative dielectrics with dielectric constants greater than those of silicon oxide and nitride are being investigated. Various dielectric materials are available, such as tantalum pentoxide (dielectric constant about 25 versus silicon nitride's dielectric constant of about 7) as described in Ohji et al., "$Ta_2O_5$ capacitors' dielectric material for Giga-bit DRAMs," IEEE IEDM Tech. Dig. 5.1.1 (1995); lead zirconate titanate (PZT), which is a ferroelectric and supports nonvolatile charge storage (dielectric constant of about 1000), described in Nakamura et al., "Preparation of $Pb(Zr,Ti)O_3$ thin films on electrodes including $IrO_2$, 65 Appl. Phys. Lett. 1522 (1994); strontium bismuth tantalate (also a ferroelectric) described in Jiang et al. "A New Electrode Technology for High-Density Nonvolatile Ferroelectric ($SrBi_2Ta_2O_9$) Memories," VLSI Tech. Symp. 26 (1996); and barium strontium titanate (dielectric constant about 500), described in Yamamichi et al., "An ECR MOCVD $(Ba,Sr)TiO_3$ based stacked capacitor technology with $RuO_2/Ru/TiN/TiSi_x$ storage nodes for Gbit-scale DRAMs," IEEE IEDM Tech. Dig. 5.3.1 (1995), Yuuki et al., "Novel Stacked Capacitor Technology for 1 Gbit DRAMs with CVD-$(Ba,Sr)TiO_3$ Thin Films on a Thick Storage Node of Ru," IEEE IEDM Tech. Dig. 5.2.1 (1995), and Park et al., "A Stack Capacitor Technology with $(Ba,Sr)TiO_3$ Dielectrics and Pt Electrodes for 1 Giga-Bit density DRAM, VLSI Tech. Symp. 24 (1996). Also see Dietz et al., "Electrode influence on the charge transport through $SrTiO_3$ thin films, 78 J. Appl. Phys. 6113 (1995), (describes electrodes of Pt, Pd, Au, and so forth on strontium titanate); U.S. Pat. No. 5,003,428 (PZT and barium titanate), U.S. Pat. No. 5,418,388 (BST, $SrTiO_3$, PZT, etc.), and U.S. Pat. No. 5,566,045 (thin Pt on BST).

These alternative dielectrics are typically deposited at elevated temperatures and in an oxidizing ambient. As a result, an oxygen-stable bottom electrode material such as platinum or ruthenium oxide is used. Platinum, however, readily forms a silicide when in direct contact with silicon, and further is not a good barrier to oxygen due to fast diffusion down the platinum grain boundaries. In U.S. Pat. No. 5,504,041, Summerfelt uses a conductive nitride barrier layer beneath a platinum electrode to inhibit diffusion of oxygen to an underlayer susceptible to oxidation. Another problem with platinum electrodes is that the adhesion of platinum to silicon dioxide, silicon nitride, and other common interlayer dielectric materials is poor. Platinum structures that are patterned and etched tend to debond during subsequent processing. U.S. Pat. Nos. 5,489,548; 5,609,927; and 5,612,574 propose the use of an adhesion layer to prevent the debonding of the platinum electrode.

Some of these alternative dielectrics, such as PZT, BST, and SBT are ferroelectrics, and hence may be used as the storage element in ferroelectric non-volatile RAMs (FRAM). An FRAM cell is similar to a DRAM cell, except that the polarization of the ferroelectric material is used to indicate the data content of the cell in an FRAM, while electrical charge in the material indicates the data content of the cell in a DRAM. The charge in the DRAM dissipates, while the polarization of the material is non-volatile.

SUMMARY OF THE INVENTION

In accordance with a preferred embodiment of the invention, there is disclosed a method for fabricating an integrated circuit including a plurality of metal layers separated by dielectric layers. The method includes the steps of: forming a first conductive layer; covering the first conductive layer with a conductive etchstop layer; patterning and etching the etchstop layer in a desired pattern; removing portions of the first metal layer not covered by the patterned etchstop layer; and covering the etchstop layer plus first conductive layer with an interlevel dielectric layer. The method also includes etching a portion of the interlevel dielectric layer above the etchstop layer plus first conductive layer with an etchant that removes the interlevel dielectric layer at least thirty times faster than the etchstop layer to form a via through the interlevel dielectric layer having a bottom on the etchstop layer. The via is then filled with a second conductive layer.

In accordance with another preferred embodiment of the invention, there is disclosed a high-selectivity via etching process. The process includes the steps of: forming an etchstop layer of a material selected from the group consisting of Ti—Al, Ti—Al—N, Ta—Al, Al—N, Ti—Al/Ti—N, Ti—Al—N/Ti—N, Ta—Al/Ti—N, and Ti—Al/Ti—Al—N; forming a dielectric layer over the etchstop layer; and etching the dielectric layer with a fluorine-bearing etchant.

In accordance with still another preferred embodiment of the invention, there is disclosed an integrated circuit. The circuit includes a first conductive layer; a etchstop layer covering the first conductive layer, the etchstop layer selected from the group consisting of Ti—Al, Ti—Al—N, Ta—Al, Al—N, Ti—Al/Ti—N, Ti—Al—N/Ti—N, Ta—Al/Ti—N, and Ti—Al/Ti—Al—N; a dielectric layer covering the etchstop layer; and a conductor-filled via through the dielectric layer coupling the etchstop layer-covered first conductive layer to a second conductive layer.

An advantage of the inventive concepts is that the featured materials have high etch selectivities versus commonly-used interlayer dielectrics. Thus, via etch steps involving long overetch, such as when two vias with vastly different depths are etched in the same step, are made possible without etching through the etchstop layer. In addition to serving as highly effective etchstop layers, the featured materials are also good hardmask materials, particularly for difficult-to-etch materials like platinum.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Overview

Preferred embodiments provide for capacitors with enhanced electrode adhesion to adjacent materials and an effective barrier to oxidation. Additional embodiments provide methods for fabricating electrodes with steep sidewall profiles and an effective barrier to oxidation and reaction, and methods for covering an electrode and facilitating subsequent process steps. The preferred embodiments may be used in DRAMs, FRAMs, and other types of integrated circuits.

Figure 1A:
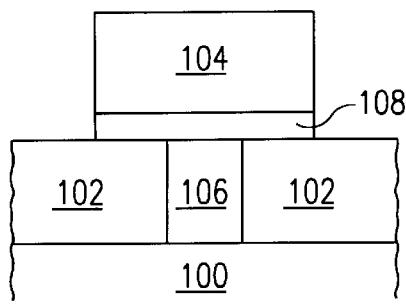
FIGS. 1a and 1b are cross-sectional views of prior art electrodes.
Figure 1B:
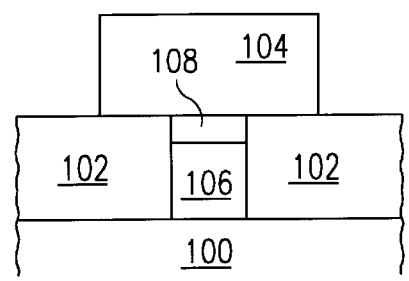

FIGS. 1a and 1b illustrate in cross-sectional view two prior art electrodes. The structure is fabricated on a semiconductor substrate 100. The capacitor is typically spaced from the substrate surface by an interlayer dielectric 102 to allow for transistors, bitlines, and so forth nearer the substrate surface. Connection between the electrode 104 and the substrate surface is made by conductive plug 106. Reaction/oxidation barrier 108 is placed between the electrode, which is typically composed of platinum, and the plug, which is typically composed of polysilicon. In the absence of barrier 108, platinum silicide would form at temperatures around 400° C. between the platinum electrode and polysilicon plug. In the presence of oxygen, an insulator, silicon dioxide, would form from the platinum silicide and the conductivity of the plug/barrier/electrode combination would suffer.

Interlayer dielectric 102 is typically silicon dioxide or silicon nitride. Platinum does not adhere well to either of these materials. The adhesion of ruthenium and iridium may be better than that of platinum, but still may be insufficient to yield acceptable fine-patterned features and may not have longterm reliability due to adhesion loss. A prior art method for improving adhesion to dielectric materials is the use of a thin intermediate layer. Summerfelt, in U.S. Pat. No. 5,612,574, proposes titanium, tantalum, and ruthenium as a thin adhesion-promoting layer. In the prior art structure shown in FIG. 1a, the barrier layer 108 may provide acceptable adhesion since it lies between the interlayer dielectric 102 and the platinum bottom electrode 104 for the full extent of the electrode. Such an approach is proposed in U.S. Pat. No. 5,504,041. A disadvantage of this approach is that the exposed portion of barrier layer 108 is prone to oxidation during the deposition over electrode 104 of the high dielectric constant or ferroelectric capacitor dielectric (not shown). While the structure of FIG. 1b avoids this problem of barrier oxidation, it suffers from poor adhesion between bottom electrode 104 and interlayer dielectric 102.

Structures

Figure 2:
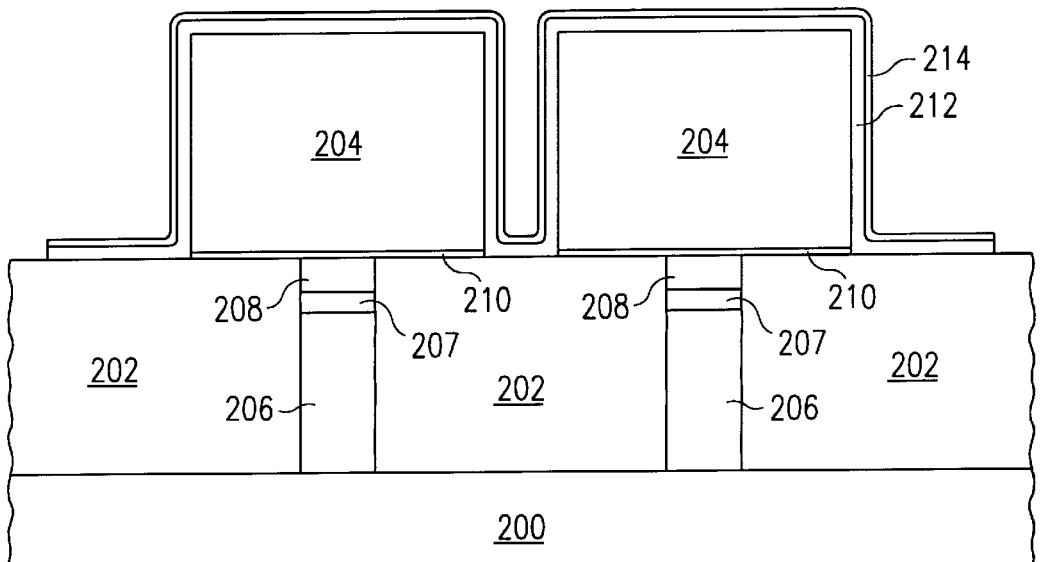
FIG. 2 is a cross-sectional diagram of a preferred embodiment capacitor.

FIG. 2 illustrates in cross-sectional view a preferred embodiment capacitor. Two of said capacitors are shown to clarify the relation of adjacent bottom electrodes 204. Substrate 200 is a semiconductor material, preferably silicon or silicon-on-insulator. Interlayer dielectric 202 is preferably silicon dioxide ($SiO_2$), but examples of alternatives include the following: $Si_3N_4$, Si—N, Si—O, Si—O—N, doped versions of $SiO_2$ and the previously listed materials, $TiO_2$, $Al_2O_3$, $ZrO_2$, MgO, $Ta_2O_5$, $V_2O_5$, $Y_2O_3$, and $Nb_2O_5$. Note that the interlayer dielectric may comprise multiple layers of different materials or combinations of the above materials. Note also that the notation "A-B-C" indicates that the material may exist in varying compositions of the elements A, B, and C, an example being "Si—O—N". The thickness of the interlayer dielectric is chosen to clear underlying structures such as transistor gates and bitline structures (not shown), with a representative thickness is approximately 200 nm. Conductive plug 206 is preferably phosphorus-doped silicon, and is of a width of approximately 100 nm. Examples of alternative plug materials include the following: Ti—N, Ti—Al—N, W, Cu, Al—Cu, Al, Ti, Ti—Si—N, W—Si—N, Ti—Si, Ta—Si, W—Si, and $TiSi_2$. Barrier layer 208 is preferably Ti—Al—N in which the composition ranges between Ti—N and ($Ti_{0.5}Al_{0.5}$)—N, and is preferably ($Ti_{0.75}Al_{0.25}$)—N. The thickness of the barrier may range between 10 nm and 100 nm, but the preferred range is between 20 and 50 nm. Examples of alternative barrier materials include the following: Ta—N, Ta—Al—N, Ti—Si—N, W—Si—N, Ru—N, W—N, Ru—Al—N, Ru—Si—N, Cr—N, Cr—Al—N, Mo—N, Mo—Al—N, Mo—Si—N, V—N, V—Si—N, V—Al—N, Hf—N, Hf—Al—N, ternary (or greater) nitrides (such as Ta—Si—N, Ta—B—N, Ti—B—N), Zr—N, Y—N, Sc—N, La—N, nitrogen deficient Al—N, doped Al—N, Mg—N, Ca—N, Sr—N, Ba—N, alloys of the above. Additional alternative barrier materials include noble-metal-insulator alloys such as Pt—Si—N, Pd—Si—O, Pd—Si—O, Pd—B—(O,N), Pd—Al—N, Ru—Si—(O,N), Ir—Si—O, Re—Si—N, Rh—Al—O, Au—Si—N, and Ag—Si—N. Note that the barrier layer may comprise multiple layers of different materials or combinations of the above materials. Conductive plug 206 and barrier layer 208 may be separated by a silicide layer 207, such as $TiSi_2$.

Bottom electrode 204 is preferably platinum having a thickness in the range of approximately 30 nm to 1000 nm and preferably about 350 nm. The footprint of the electrode for DRAMs is oblong, with dimensions of f×3f, where f is the critical dimension (i.e. the smallest dimension of the electrode). The critical dimension of the DRAM is in the range of approximately 0.05 to 1 μm, and is preferably about 0.16 μm. The electrode for an FRAM, however, typically has a critical dimension of about 1 μm or smaller. Alternative materials for the bottom electrode include the following: Ru, Rh, Pd, Re, Ir, plus alloys between any of the preceding, Pt—O, $RuO_2$, Ru—O, Rh—O, Pd—O, $IrO_2$, Ir—O, Re—O, plus alloys of the preceding (oxygen-containing alloys, e.g. Pt—Rh—O), $SrRuO_3$, Sn—O, and In—Sn—O. Note that the bottom electrode may comprise multiple layers of different materials or combinations of the above materials. Adhesion-promoting layer 210 is conductive and is preferably Ti—Al—N in which the composition ranges between Ti—N and ($Ti_{0.5}Al_{0.5}$)—N, and is preferably ($Ti_{0.75}Al_{0.25}$)—N. The adhesion-promoting layer has a thickness in the range of approximately 0.2 nm to 10 nm, with the preferred thickness being approximately 3 nm. Note that adhesion-promoting layer 210 is discontinuous between the two capacitors in order to provide for electrical isolation of the bottom electrodes 204. Examples of alternative materials for the adhesion-promoting layer include the following: Ta—Al—N, Ti—Si—N, W—Si—N, W—N, W—Si—N, Cr—N, Cr—Al—N, Mo—N, Mo—Al—N, Mo—Si—N, Si—N, Si, Ge, V, V—N, V—Si—N, V—Al—N, Ti—Si, Ta—Si, W—Si, Mo—Si, Cr—Si, Pt—Si, W, Ta, Ti, Sn, Ru, In, Os, Rh, Ir, ternary (or greater) nitrides (such as Ta—Si—N, Ta—B—N, Ti—B—N), Zr—N, Y—N, Sc—N, La—N, nitrogen deficient Al—N, doped Al—N, Mg—N, Ca—N, Sr—N, Ba—N, and alloys of the above. Additional alternative adhesion-promoting materials include noble-metal-insulator alloys such as Pt—Si—N, Pd—Si—O, Pd—Si—O, Pd—B—(O,N), Pd—Al—N, Ru—Si—(O,N), Ir—Si—O, Re—Si—N, Rh—Al—O, Au—Si—N, and Ag—Si—N. Note that the adhesion -promoting layer may comprise multiple layers of different materials or combinations of the above materials.

A thin layer of silicon can also function as an adhesion-promoting layer. During subsequent thermal processing, this layer would react with the bottom electrode to form a very thin silicide layer, which could then serve as an adhesion-promoting layer. Since the amount of silicon is limited based on the deposited thickness, the amount of silicide formed would be small, and self-limiting. This is unlike the case where the barrier between the polysilicon plug and the bottom electrode fails. In that case, the reaction is not self-limiting and leads to catastrophic device failure. The thin silicide layer formed at the base of the electrode may also be sufficiently oxidation resistant, since a thin $SiO_2$ layer could form in a self-passivating manner on the small exposed region. Note that due to the thickness of this layer, this would have an insubstantial impact on the overall performance of the capacitor.

The charge storage layer or capacitor dielectric 212 is preferably Ba—Sr—Ti—O ((Ba, Sr)$TiO_3$) having a thickness in the range of approximately 3 nm to 150 nm, but preferably about 25 nm. Examples of alternative storage layer materials include $Ta_2O_5$, PZT, $Ba_{1-x}Sr_xTi_{1-y}Zr_yO_3$ (or, more generally, BSZT), $Pb_{1-x}La_xTi_{1-y}Zr_yO_3$ (or, more generally, PLZT), and $Bi_2A_{1-x}B_xO_{3x-x}$ (or, more generally, layered perovskite family of materials) where A is Ba, Sr, Ca, Pb, or Ga, and B is Ti, Ta, Zr, or Nb. In general, the preferred storage layer materials will have a dielectric constant of 50 or greater. Top electrode 214 is preferably platinum having a thickness in the range of 10 nm to 100 nm, but is preferably about 25 nm in thickness. Alternative materials for the top electrode include those listed above for the bottom electrode, plus Ti—N, Ti—Al—N, Ta—N, Ta—Al—N, W—N, W—Al—N, Cr—N, Cr—Al—N, Ru—N, Ru—Al—N, Mo—N, Mo—Al—N, V—N, V—Al—N, Hf—N, and Hf—Al—N.

Figure 3:
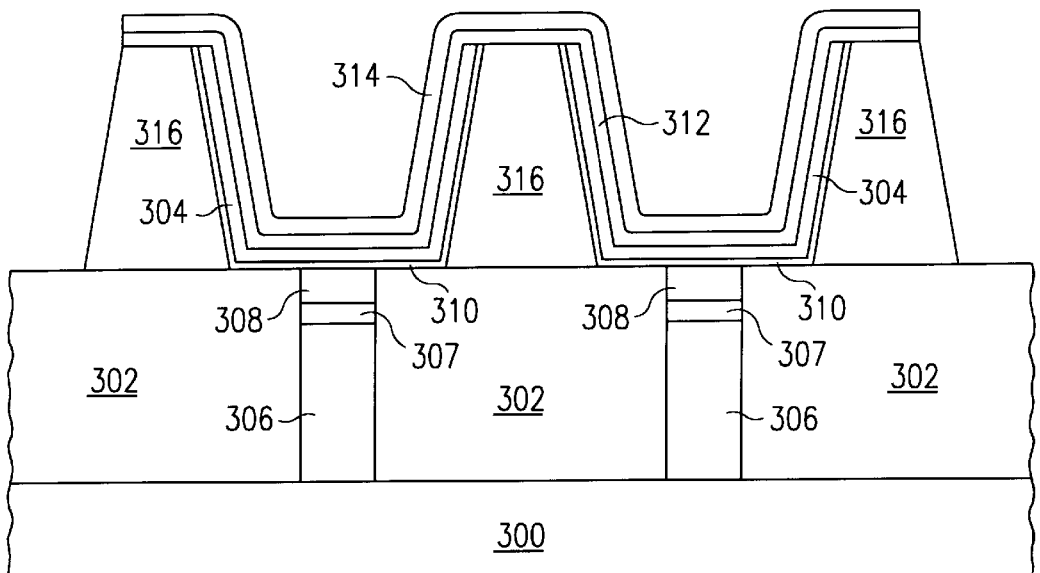
FIG. 3 is a cross-sectional diagram of a second preferred embodiment capacitor.

FIG. 3 illustrates a second preferred embodiment capacitor, again shown as a pair of capacitors to clarify the relation between adjacent capacitors. An advantage of this cell structure is that it does not require fine feature pattern and etch of the bottom electrode material. Rather, the patterning and etching is of the intercapacitor dielectric layer. Fine patterning of metal presents problems with reflectivity, and etching of platinum, in particular, is very difficult. Also, this structure allows use of a smaller amount of bottom electrode material, which may lead to material-cost savings. Another advantage of the second preferred embodiment cell is that the dielectric between the nodes need not be removed. The structure is physically stable, as compared to a crown-type cell which can have free-standing metal.

The capacitors are formed in trenches in an intercapacitor dielectric material 316, preferably $SiO_2$. The trench "footprint" is similar to the electrode of the stack (i.e. f×3f). The width of the intercapacitor dielectric is approximately f, the critical dimension. The thickness of the intercapacitor dielectric is about 350 nm. Examples of alternative dielectrics include $Si_3N_4$, Si—O, Si—N, Si—O—N and doped versions of the above. The structure of FIG. 3 provides for an increased capacitor area, and hence more capacitance, in a similar physical space. Adhesion-promoting layer 310 lines the trenches to ensure that bottom electrode 304 is not removed in subsequent process steps, but layer 310 is discontinuous between the capacitors to maintain electrical isolation of the bottom electrodes 304. Bottom electrodes 304 are thinner than in the embodiment shown in FIG. 2. The thickness ranges from approximately 10 nm to 50 nm and is preferably about 20 nm. The structure of FIG. 3 is otherwise similar to that shown in FIG. 2 and comprises interlayer dielectric 302 formed on substrate 300. The bottom electrode 304 makes contact with the substrate 300 through the conductive adhesion-promoting layer 310, the oxidation barrier 308, the silicide layer 307, and the plug 306. Bottom electrode 304 is covered with capacitor dielectric 312 and in turn by top electrode 314. Refer to the first preferred embodiment above for material choices and alternatives.

Figure 4:
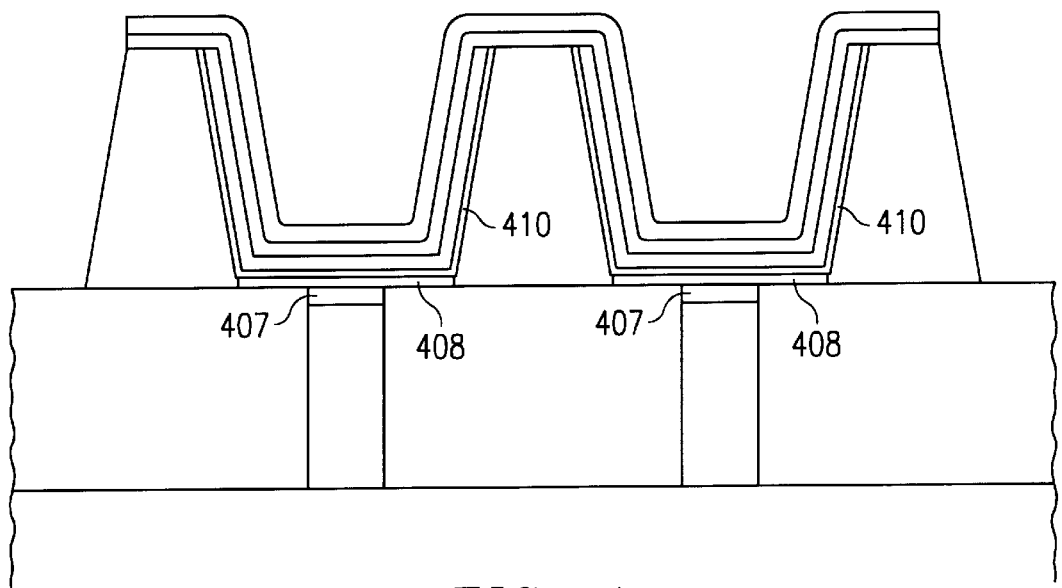
FIG. 4 is a cross-sectional diagram of a third preferred embodiment capacitor.

FIG. 4 illustrates a third preferred embodiment capacitor similar to that shown in FIG. 3, except that barrier 408 is not recessed as it is in FIG. 3. The barrier and adhesion-promoting layer 410 may be deposited in a single step with a process that allows independent control of sidewall and bottom coverage. An example of such a process is ionized sputtering, which works by thermalizing and then ionizing the sputtered flux coming off the sputtering target (these atoms are usually electrically neutral). This is accomplished by putting a coil in the chamber and energizing it with RF power. The ionized, sputtered atoms are accelerated toward the wafer, either by a self bias set up between the wafer and the plasma, or by a bias applied on the wafer by an external power supply. This acceleration changes the flux distribution that the wafer sees, making it more directional than a regular sputtering source. By adjusting the ionization and bias characteristics, more or less bottom and sidewall coverage can be obtained, as desired. Typically for this process, the bottom coverage is greater than the side coverage, making it a good approach for the trench cell, where a thicker bottom than sidewall film may be desired to enhance the barrier performance. Additionally, it is advantageous in this embodiment if the barrier and adhesion-promoting layers consist of the same material.

Figure 5:
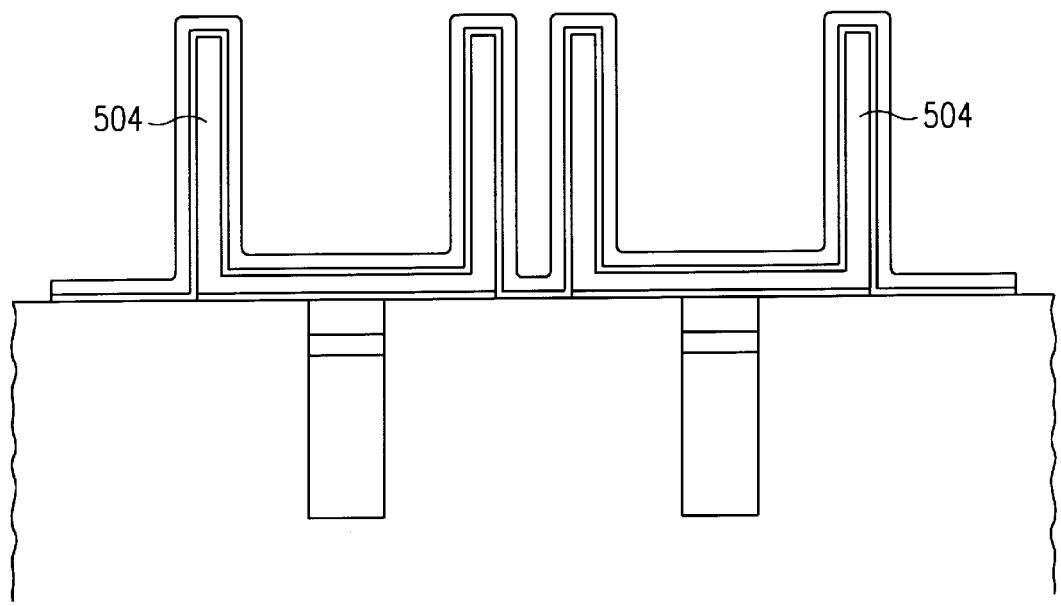
FIG. 5 is a cross-sectional diagram of a fourth preferred embodiment capacitor.

FIG. 5 illustrates a fourth preferred embodiment crown cell capacitor. The structure is similar to that of FIG. 2, except that the bottom electrode 504 is shaped to create a larger surface area. One method of forming the crown cell is to first form the plug. Deposit a sacrificial oxide layer. Pattern and etch trenches in the oxide layer over the plugs. The sidewalls are ideally vertical. Conformally deposit the bottom electrode material. Remove the bottom electrode material from the top portion of the sacrificial oxide, using chemical mechanical polishing, for example. Remove the sacrificial oxide layer and proceed with the deposition of the capacitor dielectric.

Figure 6A:
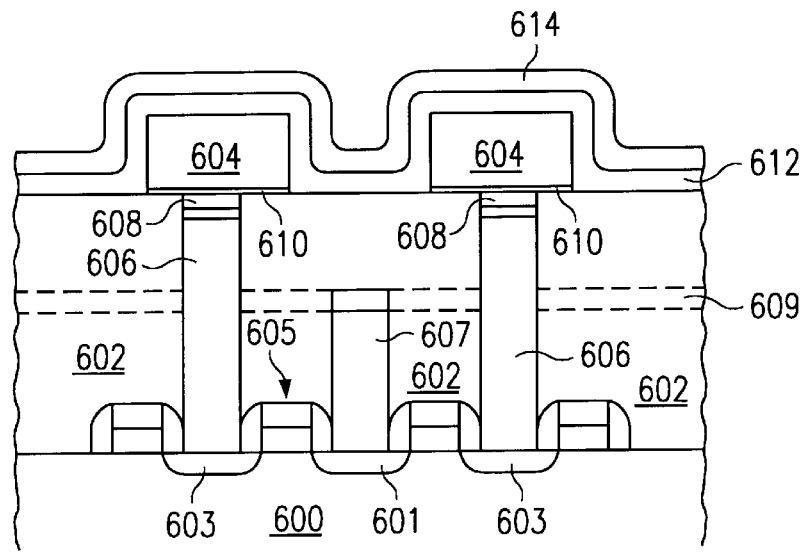
FIGS. 6a and 6b are cross-section and plan views of a preferred embodiment capacitor-over-bitline memory cell.

FIG. 6a is a cross-sectional diagram of a memory cell that incorporates the preferred embodiment shown in FIG. 2. The structure is formed on substrate 600. Sources 601 and drains 603, are implanted in substrate 600. Transistor gates 605 are separated by the sources and drains, and together form transistors. Interlayer dielectric 602 covers the transistors. Bitline contact 607 couples the transistor sources 601 to bitline 609 (shown in dashed lines to indicate that it is offset from the cross-sectional plane). Plugs 606 couple the bottom electrodes 604 to transistor drains 603. Barrier 608 and adhesion-promoting layer 610 perform the functions described above with regard to the preferred embodiment of FIG. 2. Bottom electrodes 604 are covered with capacitor dielectric 612 and a top electrode 614.

Figure 6B:
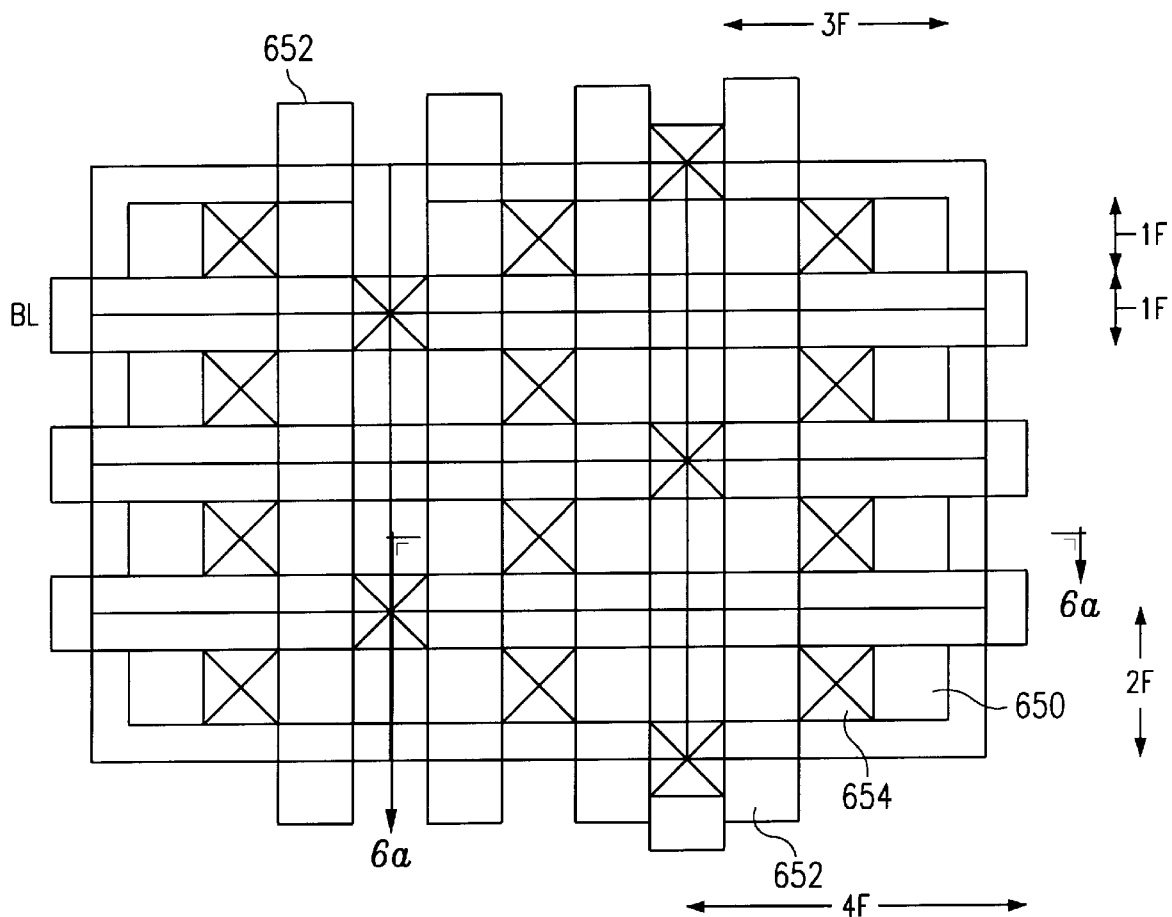

FIG. 6b is a plan view of a 1T/1C cell, one of many that together form a memory cell array of a DRAM, for example. The cross-section shown in FIG. 6a shows two of the twelve capacitors 650 of FIG. 6b. Wordlines 652 correspond to the transistor gates 605 of FIG. 6a. The plugs 606 of FIG. 6a are shown in FIG. 6b as element 654. The bitline contact 607 of FIG. 6a appears in FIG. 6b as element 656.

Figure 7:
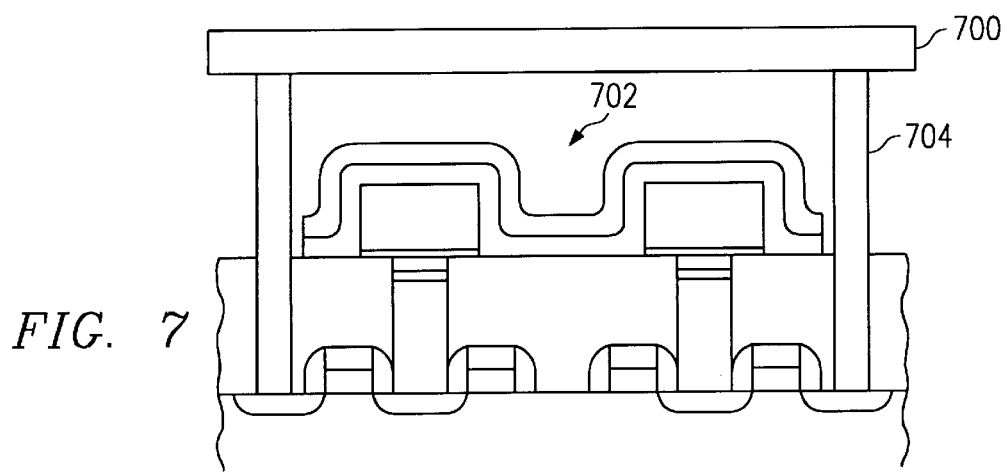
FIG. 7 is a cross-sectional view of a preferred embodiment capacitor-under-bitline memory cell.

FIG. 7 is an example of a capacitor-under-bitline (CUB) memory cell, as opposed to the capacitor-over-bitline (COB) cell shown in FIG. 6a. The structures are similar except that the bitline 700 is formed after the formation of the capacitors 702. Bitline and bitline plugs 704 are typically a metal such as tungsten, aluminum, copper, or Al—Cu.

Fabrication

Figure 8A:
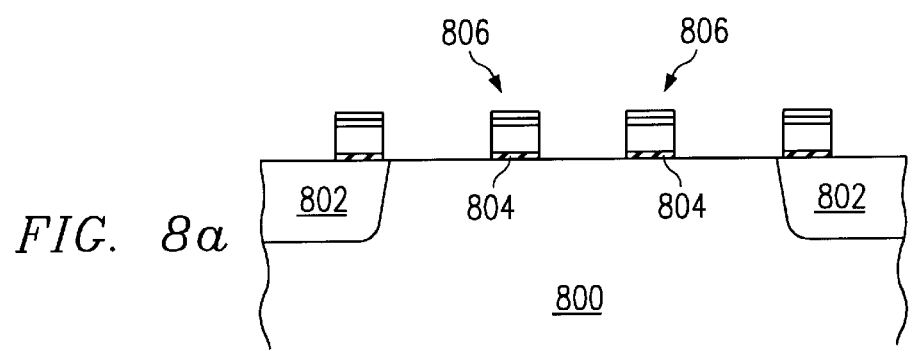
FIGS. 8a–8o are cross-sectional views of a memory cell using a preferred embodiment process.
Figure 8B:
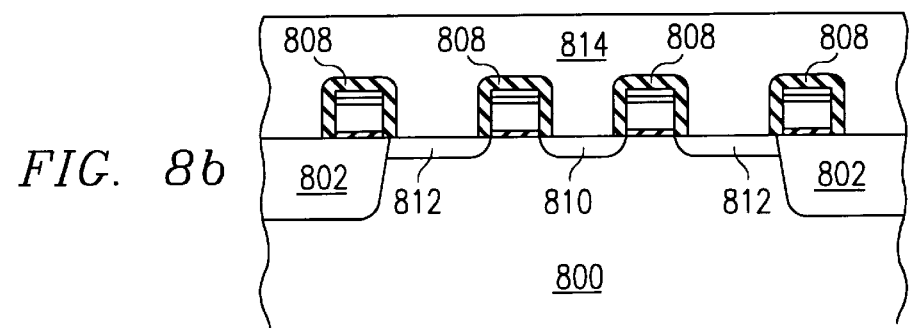
Figure 8C:
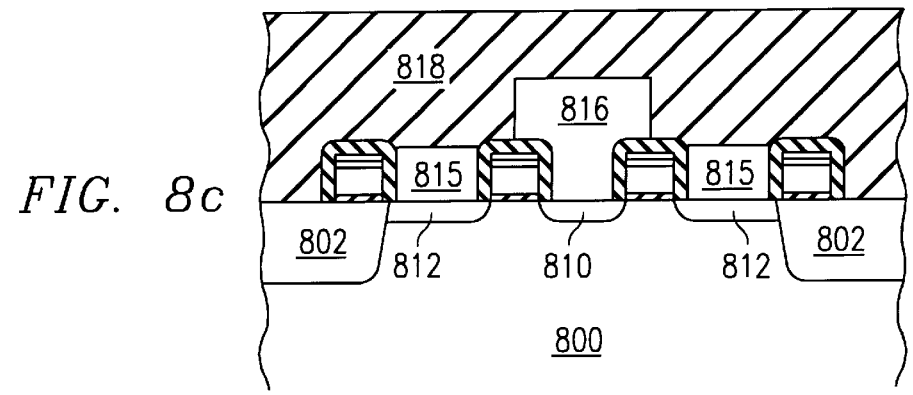
Figure 8D:
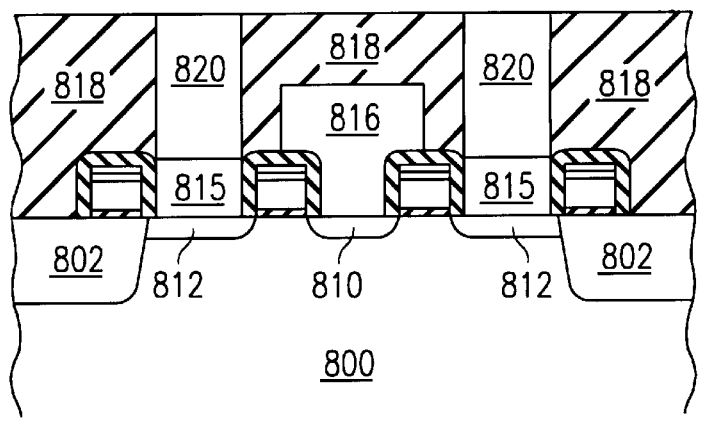
Figure 8E:
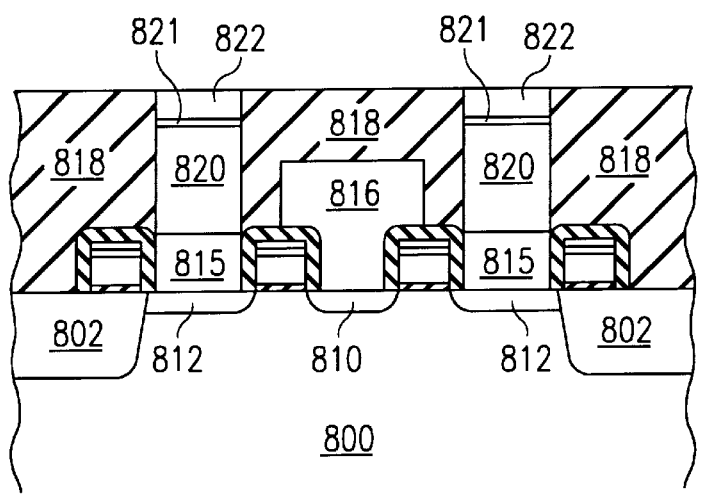
Figure 8F:
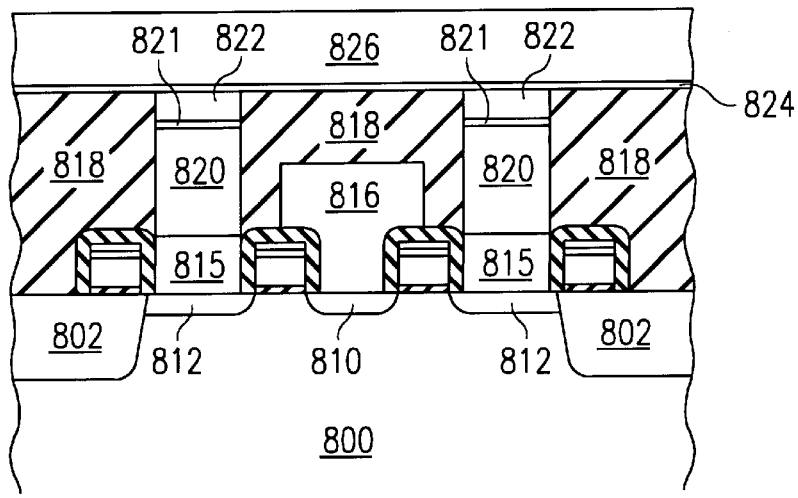
Figure 8G:
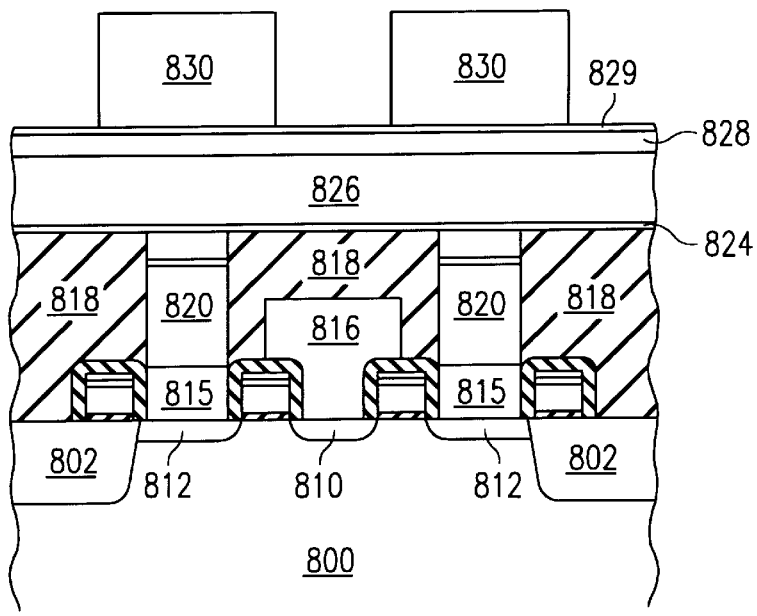
Figure 8H:
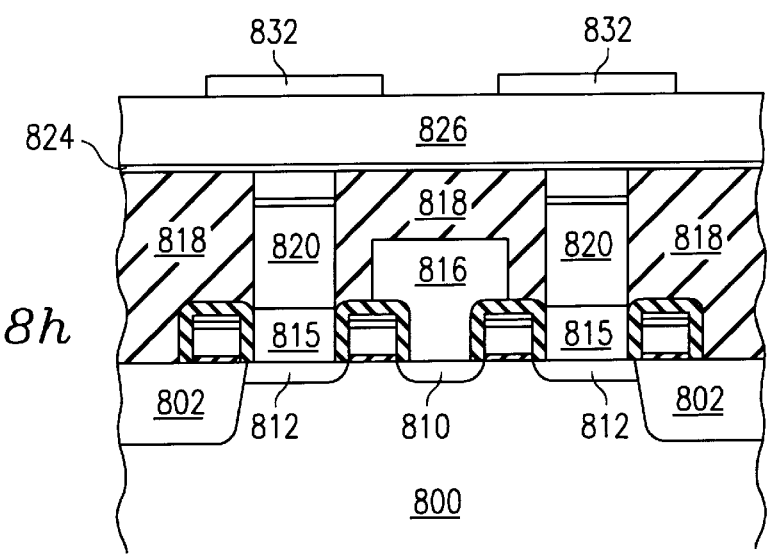
Figure 8I:
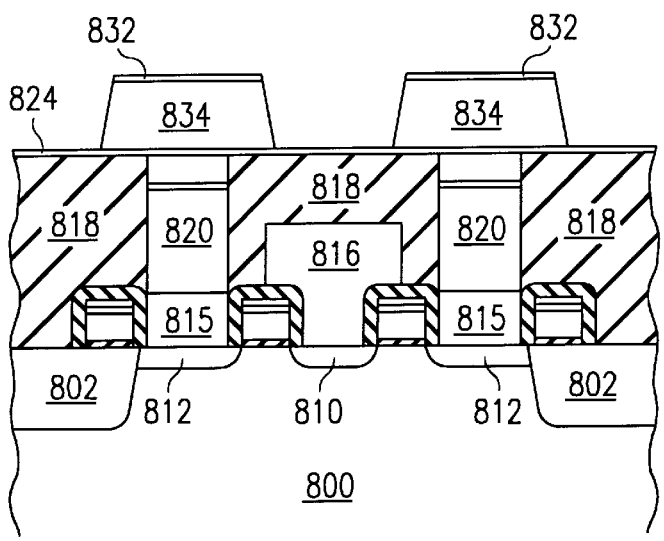
Figure 8J:
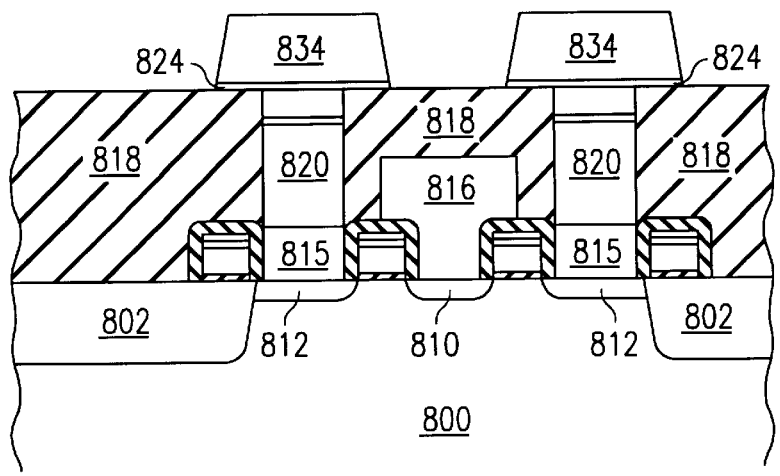
Figure 8K:
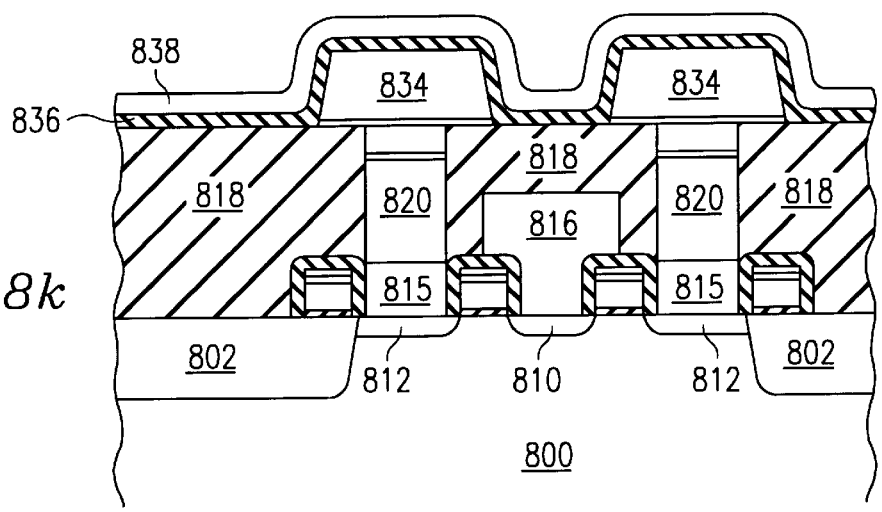
Figure 8L:
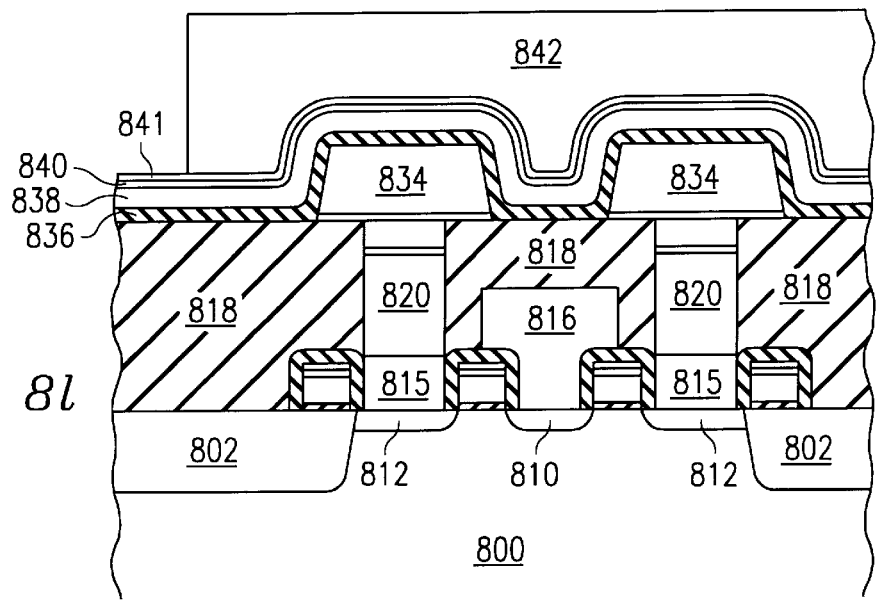
Figure 8M:
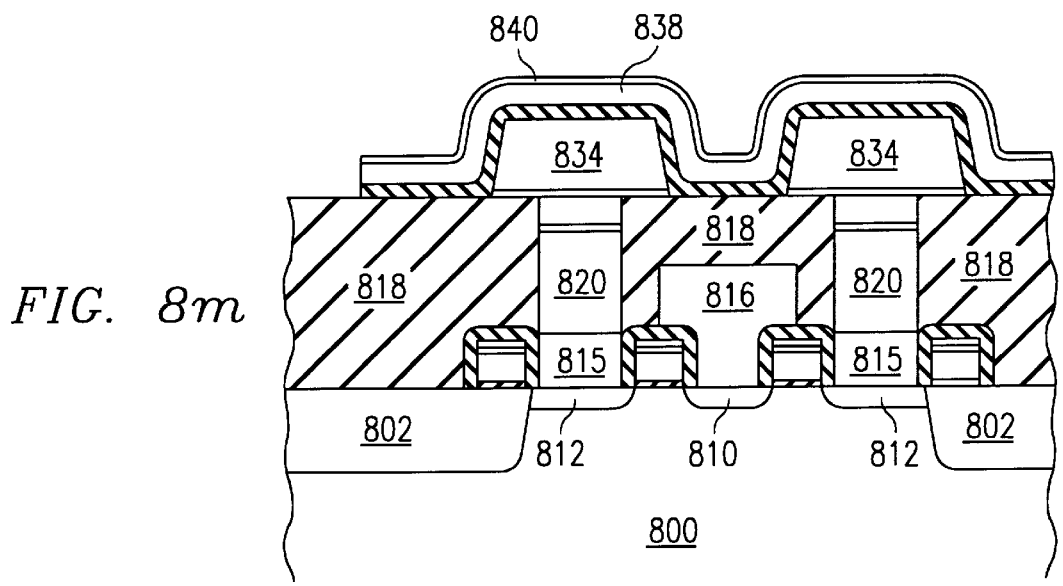
Figure 8N:
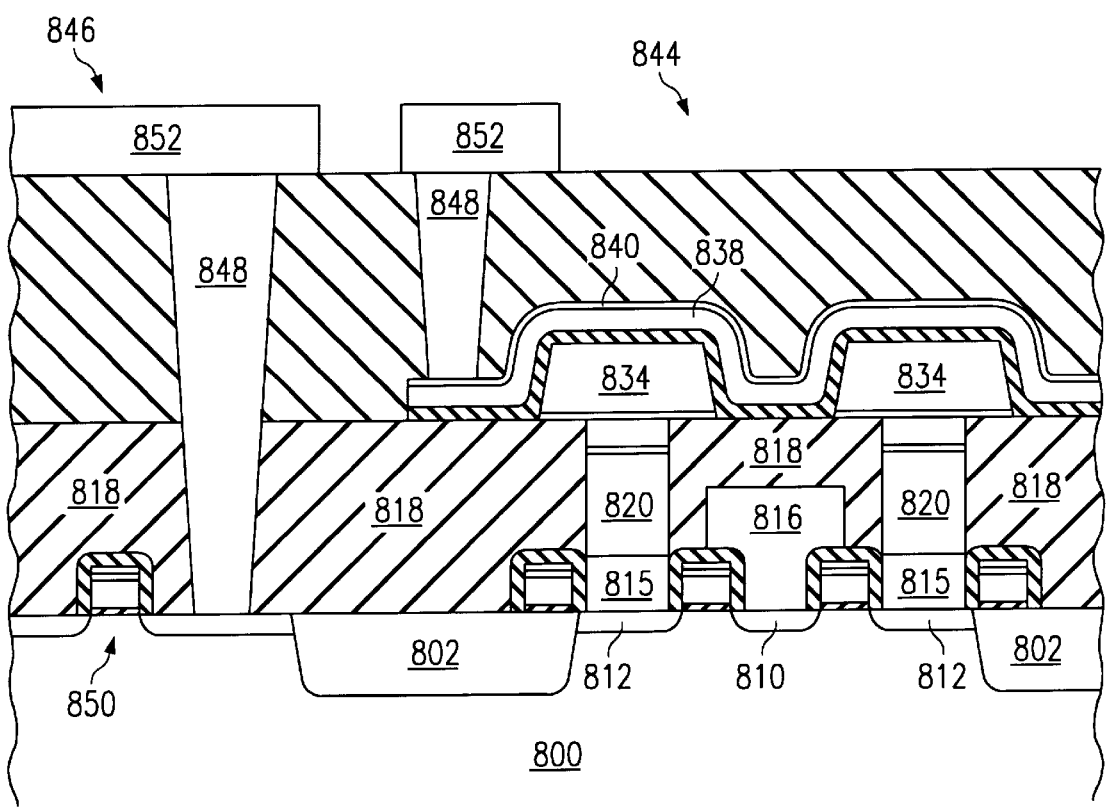
Figure 8O:
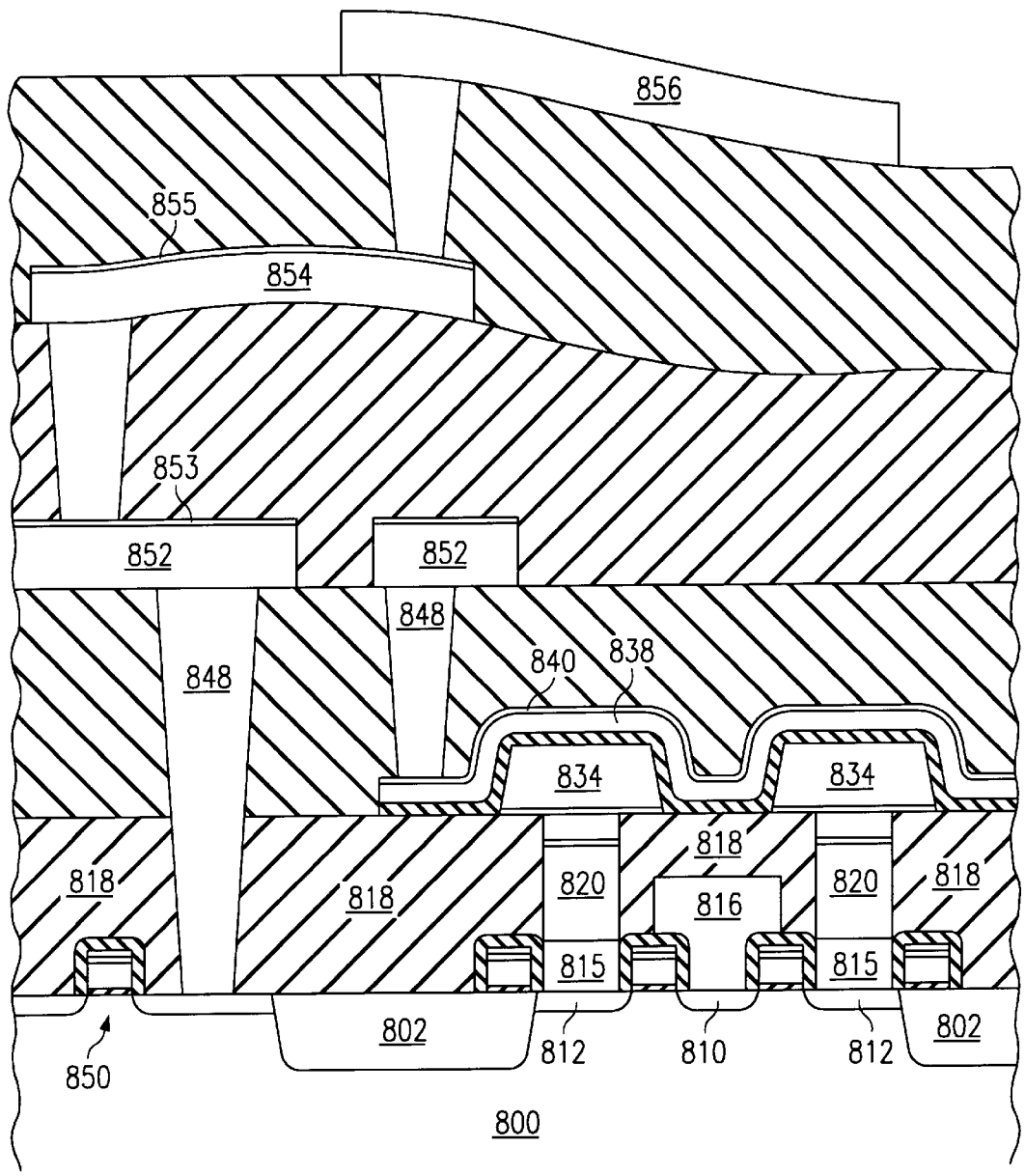
Figure 9A:
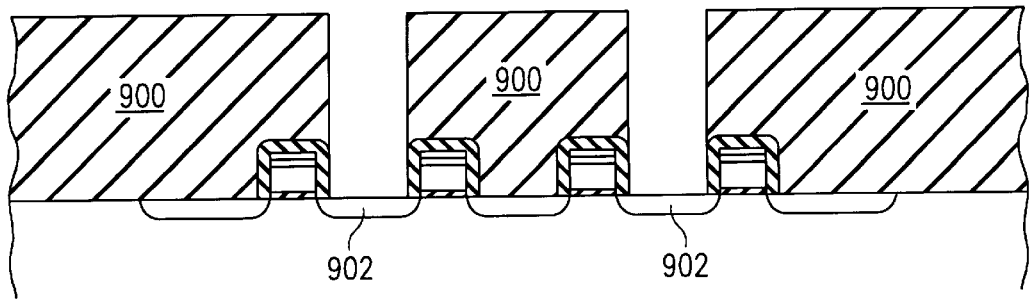
FIGS. 9a–9i are cross-sectional views of a capacitor-under-bitline memory cell using a preferred embodiment process.
Figure 9B:
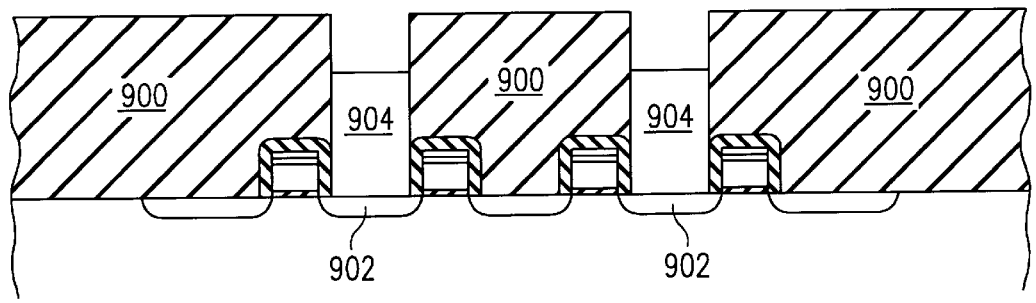
Figure 9C:
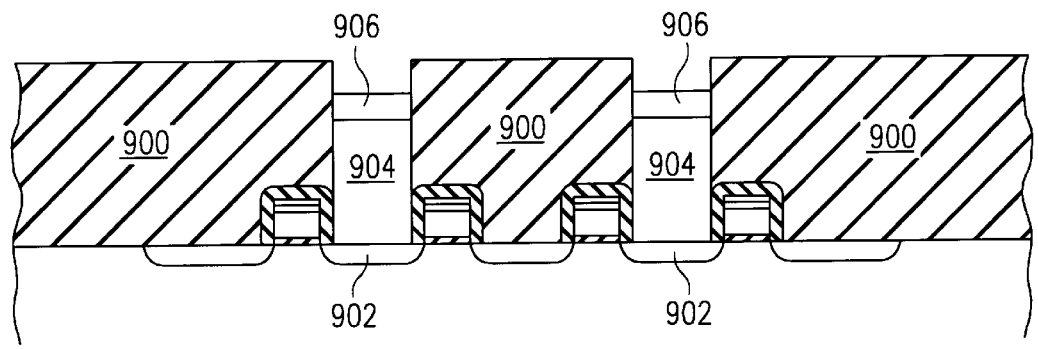
Figure 9D:
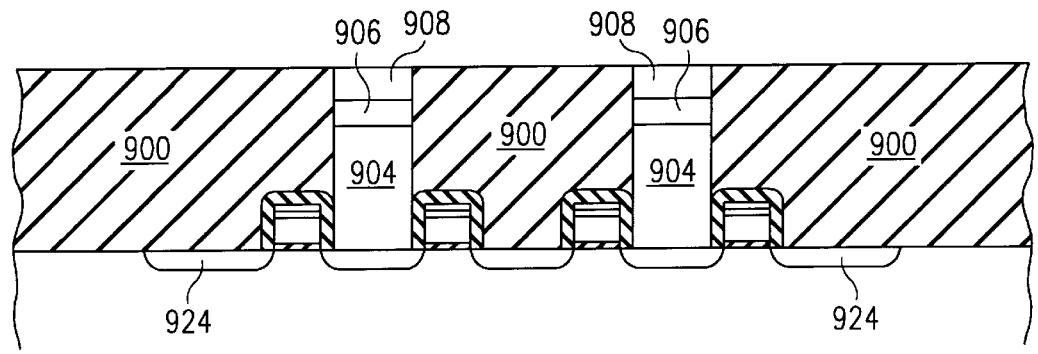
Figure 9E:
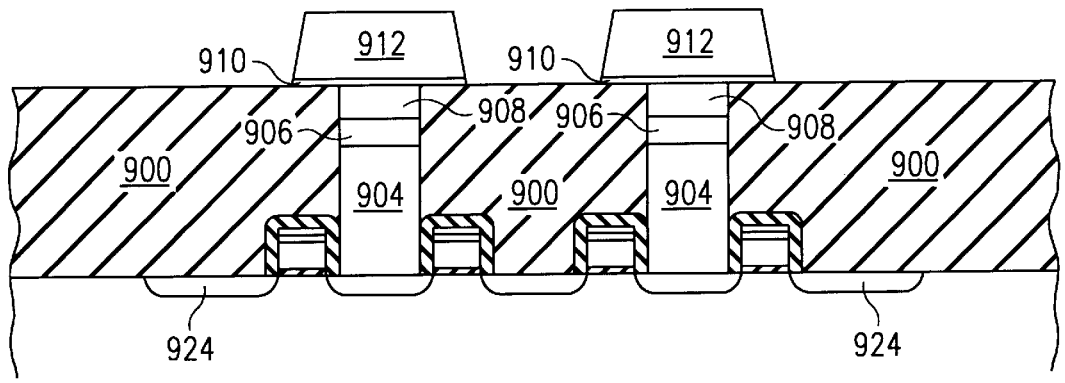
Figure 9F:
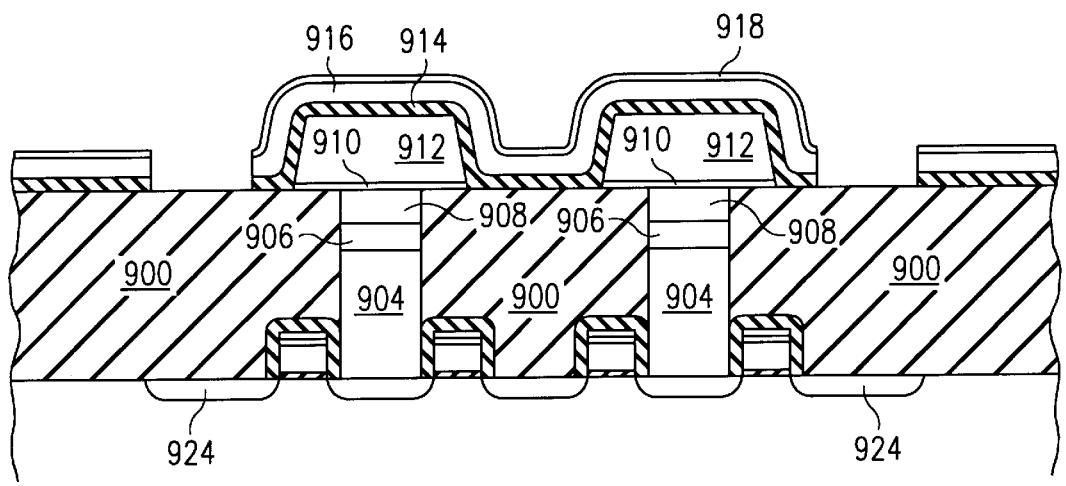
Figure 9G:
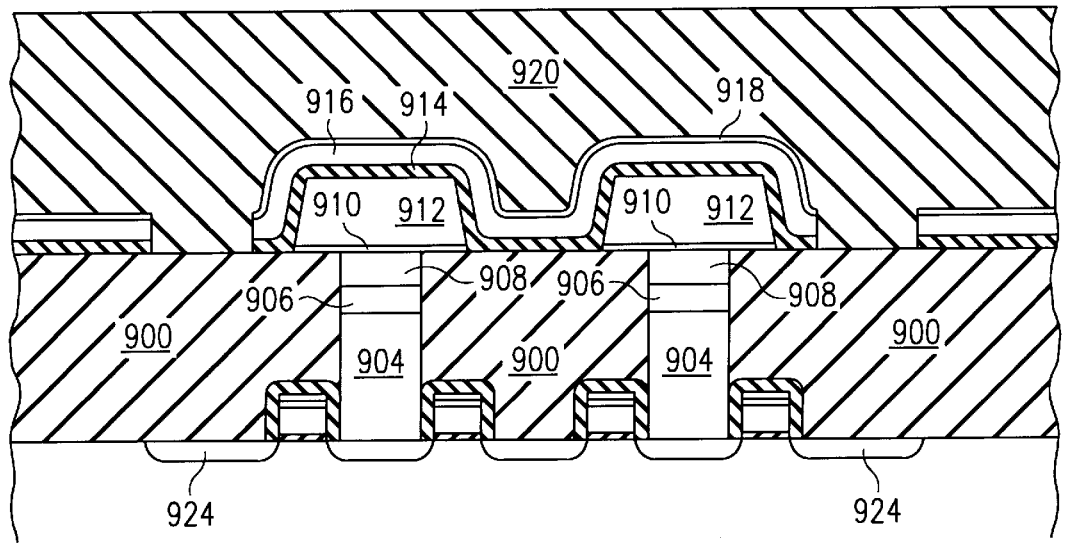
Figure 9H:
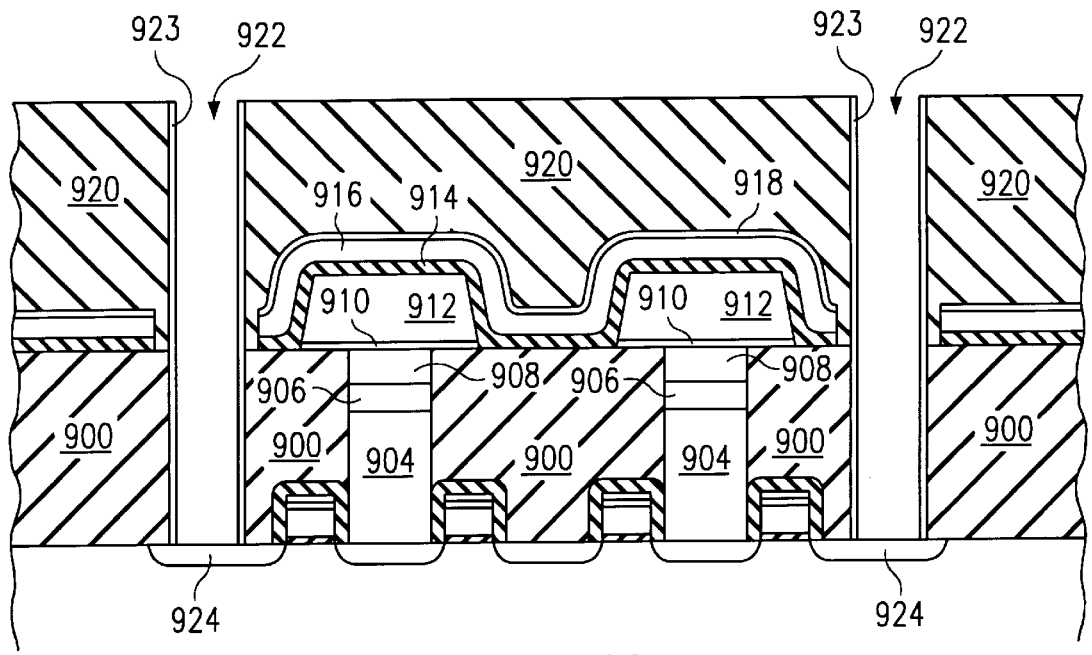
Figure 9I:
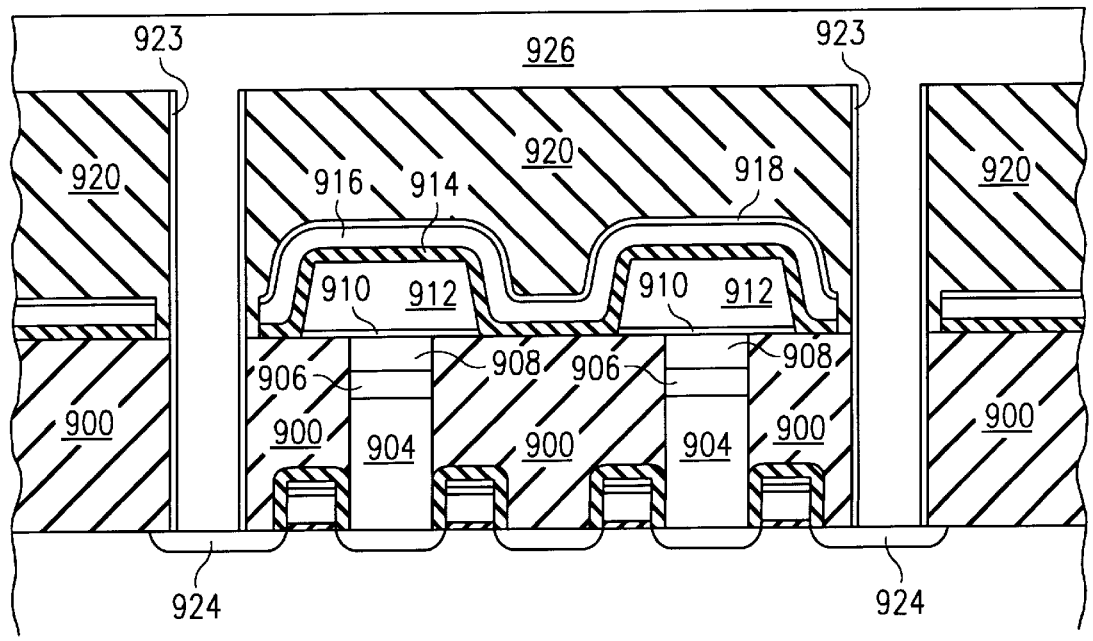

FIGS. 8a–8o illustrate the steps of an embodiment fabrication method for a DRAM in cross-sectional elevation view at the memory cell array.

(a) Start with a silicon substrate 800 (or silicon-on-insulator substrate) with shallow trench isolation 802 and twin wells for CMOS periphery circuitry and the memory cell array. Perform threshold adjustment implants (which may differ for cell transistors and various peripheral transistors), and form gate dielectric 804. Deposit tungsten silicide coated polysilicon gate material and a silicon dioxide layer, then pattern the layers to form oxide-topped gates 806 plus peripheral transistor gates and gate-level interconnects. See FIG. 8a.

(b) Perform lightly-doped-drain implants, and then form sidewall dielectric 808 on the gates by deposition plus anisotropic etching. Introduce dopants to form sources 810 and drains 812 including peripheral source/drains to complete the transistor level. Cover the structure with a planarized dielectric layer 814 (such borophosphosilicate glass). See FIG. 8b.

(c) Photolithographically define and etch holes (vias) in the planarized dielectric down to sources 812. Blanket deposit in situ p-doped polysilicon and etch back to form stems 815 in the holes. Photolithographically define and etch holes in the planarized dielectric down to the drains 810. Blanket deposit in-situ-doped polysilicon and then a tungsten silicide cap, and pattern it to form bitlines 816 connecting to drains. Form planarized above-bitline dielectric 818, which may contain an etchstop sublayer (e.g., sublayers of oxide and nitride), but is preferably 500 nm of $SiO_2$ formed from tetraethyloxysilane precursor. See FIG. 8c.

(d) Form capacitor storage node contact opening in planarized above-bitline dielectric 818. Fill opening with polysilicon 820. Planarize the polysilicon and remove any excess from the surface of above-bitline dielectric 818 with a chemical mechanical polishing technique, for example. See FIG. 8d.

(e) Remove polysilicon 820 from the opening to a depth in the range of approximately 20 nm to 50 nm. A titanium silicide layer is then formed at the top of the remaining polysilicon plug using the following process, for example. Perform silicon deglaze by using hydrofluoric acid to remove the native oxide. Deposit titanium, then perform a rapid thermal anneal at about 725° C. in a nitrogen atmosphere to cause a reaction between the titanium and silicon. Remove unreacted titanium and Ti—N.

Sputter deposit ($Ti_{0.75}Al_{0.25}$)—N to fill the remainder of the space created by the removal of polysilicon 820 and to blanket the surface of above-bitline dielectric 818. Planarize the barrier material and remove it from the surface of the bitline dielectric with a planarizing technique such as CMP. This creates a plug comprising polysilicon portion 820 and Ti—Al—N barrier portion 822, and separated by silicide portion 821. See FIG. 8e. The presence of barrier 822 provides at least two significant advantages: 1) the polysilicon plug/barrier and the electrode/barrier interfaces are protected from the oxidizing atmosphere present during BST deposition, for example; and 2) the polysilicon plug would be protected by the oxidation resistant barrier after bottom electrode patterning even in case of lithographic misalignment, a significant concern for small geometries.

(f) Deposit a thin adhesion-promoting layer 824 of ($Ti_{0.75}Al_{0.25}$)—N (approximately 3 nm) to cover the structure, followed by a 350 nm bottom electrode layer 826 of platinum. Both layers can be formed through sputter deposition. See FIG. 8f.

(g) Deposit an approximately 20 nm hardmask layer 828 of Ti—Al—N, to cover bottom electrode layer 826. Deposit an anti-reflection coating (ARC) layer 829, comprising Si—O—N or an organic layer, for example. Deposit and pattern photoresist 830 to form the bottom electrodes. See FIG. 8g. Examples of alternative hardmask materials include the following: Ti—N, Ta—N, Ta—Al—N, Ti—Si—N, W—Si—N, Ru—N, W—N, Ru—Al—N, Ru—Si—N, Cr—N, Cr—Al—N, Mo—N, Mo—Al—N, Mo—Si—N, V—N, V—Si—N, V—Al—N, Hf—N, Hf—Al—N, ternary (or greater) nitrides (such as Ta—Si—N, Ta—B—N, Ti—B—N), Zr—N, Y—N, Sc—N, La—N, Al—N, doped Al—N, Mg—N, Ca—N, Sr—N, Ba—N, alloys of the above with Ti—N, Ga—N, Ni—N, Co—N, Ta—N, and W—N. A class of alternative hardmask materials includes all of the above without nitrogen, e.g., Ti, V—Al, and so forth. Additional alternative hardmask materials include noble-metal-insulator alloys such as Pt—Si—N, Pd—Si—O, Pd—Si—O, Pd—B—(O,N), Pd—Al—N, Ru—Si—(O,N), Ir—Si—O, Re—Si—N, Rh—Al—O, Au—Si—N, and Ag—Si—N. Note that the hardmask layer may comprise multiple layers of different materials or combinations of the above materials.

(h) Remove the portion of hardmask layer 828 and ARC layer 829 left uncovered by photoresist 830 using a relatively high-pressure, low bias, chlorine-based plasma. This etch is performed in an electron cyclotron resonance plasma etcher, for example, under the following conditions: pressure 6.0 mTorr; source power 1500 W; RF bias power 300 W; $Cl_2$ flow rate of 50 sccm; and Ar flow rate of 10 sccm. See Table I for alternative etch conditions. Photoresist 830 is then ashed in an $O_2$ plasma and the ARC layer is removed (ARC layer 829 can optionally be left on as part of the hardmask). The removal of the photoresist and ARC leaves hardmask patterns 832 on bottom electrode layer 826. See FIG. 8h.

(i) Remove the portion of bottom electrode layer 826 not covered by hardmask patterns 832 with a relatively low-pressure, high-bias $Ar/O_2$, $Cl_2/O_2$, or $Ar/O_2/Cl_2$ high-density plasma to form bottom electrodes 834. The etch of the platinum bottom electrode is performed under the following conditions: pressure 2.0 mTorr; source power 1500 W; RF bias power 900 W; Ar flow rate of 40 sccm; and $O_2$ flow rate of 10 sccm. The electrode etch stops on the Ti—Al—N adhesion-promoting layer 824. This process results in fence-free bottom electrodes and no elaborate post-etch cleanup is required.

(j) Remove the Ti—Al—N adhesion-promoting layer 824 from areas left uncovered by bottom electrodes 834 and hardmask 832. Etching of layer 824 is performed under the following conditions: pressure 6.0 mTorr; source power 1500 W; RF bias power 300 W; Cl$_2$ flow rate of 50 sccm; and Ar flow rate of 10 sccm. An overetch is then performed under the same conditions. The overetch may extend into the interlayer or above-bitline dielectric 818, though this is not shown in FIG. 8j. This overetch can be advantageous in that the capacitor dielectric (e.g. BST) that is subsequently applied may more uniformly coat the bottom electrode 834, particularly near the bottom of the electrode, than if no overetch were employed. It is theorized that a structure with a BST layer that is continuous (i.e. is not required to fill a corner) at the Ti—Al—N 824 to dielectric 818 interface may suffer fewer stress-induced defects.

(k) Deposit an approximately 40 nm capacitor dielectric layer 836 of Ba$_{0.5}$Sr$_{0.5}$TiO$_3$ at about 500° C. using a technique such as RF magnetron sputtering. Then deposit an approximately 100 nm platinum top electrode field plate 838. See FIG. 8k.

(l) Deposit a (Ti$_{0.75}$Al$_{0.25}$)—N covering and hardmask layer 840 of approximately 25 nm thickness over the platinum top electrode 838. Deposit an ARC layer 841 comprising Si—O—N or an organic layer, for example. Deposit and pattern photoresist 840 to define the boundaries of the top electrode field plate. See FIG. 8l.

(m) Remove the uncovered portions of Ti—Al—N layer 840 using a relatively high-pressure, low bias, chlorine-based plasma. This etch is performed under the following conditions: pressure 6.0 mTorr; source power 1500 W; RF bias power 300 W; Cl$_2$ flow rate of 50 sccm; and Ar flow rate of 10 sccm. Remove the photoresist 842 and ARC layer 841 (ARC layer 841 can optionally be left on as a part of the hardmask). Then, using the remaining Ti—Al—N as a hardmask, remove the exposed portion of top electrode field plate 838 and the underlying BST 836 using a relatively low-pressure, high-bias Ar/O$_2$, Cl$_2$O$_2$, or Ar/O$_2$/Cl$_2$ plasma. The etch is performed under the following conditions: pressure 2.0 mTorr; source power 1500 W; RF bias power 900 W; Ar flow rate of 40 sccm; and O$_2$ flow rate of 10 sccm. See FIG. 8m. The Ti—Al—N layer serves at least three functions: 1) it acts as a hardmask for the etching of the underlying top electrode layer; 2) it covers and encapsulates (except for the exposed edges) the platinum top electrode field plate 838 to prevent contamination of process equipment with platinum in subsequent process steps; and 3) it serves as an etch stop layer in the formation of via contacts between upper metal layers and the top electrode field plate.

(n) Deposit a 500 nm thick interlayer dielectric (e.g. PETEOS) over the cell array 844 and array periphery 846. Etch vias 848 to the top of the field plate and to the periphery transistors 850 using an interlayer dielectric etch chemistry, such as Ar/CF$_4$/CHF$_3$. Deposit a liner (e.g. Ti or TiN) and a metal such as tungsten or aluminum to fill vias 848 and form the first metal layer 852. See FIG. 8n. Alternative materials and etch procedures are provided below in the section titled "Via Etch Stop Layer".

(o) Subsequent metal layers such as the second metal layer 854 and third metal layer 856 could also benefit from the vias etch stop applied in step (n). For example, first metal layer 852 could be etched using a Ti—Al—N hardmask 853 that also serves as a via etch stop for vias from the second metal layer 854. A Ti—Al—N hardmask 855 used to form second metal layer 854 could be used as an effective etch stop for vias coupling the second metal layer to the third metal layer.

FIGS. 9a to 9i illustrate a preferred embodiment process for fabricating a capacitor-under-bitline memory cell. Begin with the transistors formed as in the process described above. A planarized dielectric layer 900 is formed over the structure. (e.g. from a TEOS precursor)

(a) Photolithographically define and etch holes (vias) in the planarized dielectric down to sources 902. See FIG. 9a.

(b) Blanket deposit in situ p-doped polysilicon and etch back to form stems 904 in the holes. See FIG. 9b.

(c) Form a titanium silicide layer 906 at the top of the polysilicon plug using the following process, for example. Perform silicon deglaze by using hydrofluoric acid to remove the native oxide. Deposit titanium, then perform a rapid thermal anneal at about 725° C. in a nitrogen atmosphere to cause a reaction between the titanium and silicon. Remove unreacted titanium and Ti—N. See FIG. 9c.

(d) Sputter deposit (Ti$_{0.75}$Al$_{0.25}$)—N to fill the remainder of the space created by the removal of polysilicon 904 and to blanket the surface of the planarized dielectric 900. Planarize the barrier material and remove it from the surface of the bitline dielectric with a planarizing technique such as CMP. This creates a plug comprising polysilicon portion 904 and Ti—Al—N barrier portion 908, and separated by silicide portion 906. See FIG. 9d.

(e) Deposit a thin adhesion-promoting layer 910 of (Ti$_{0.75}$Al$_{0.25}$)—N (approximately 3 nm) to cover the structure, followed by a 350 nm bottom electrode layer 912 of platinum. Both layers can be formed through sputter deposition. Deposit an approximately 20 nm hardmask layer of Ti—Al—N (not shown), to cover bottom electrode layer 912. Deposit an anti-reflection coating (ARC) layer (not shown), comprising Si—O—N or an organic layer, for example. Deposit and pattern photoresist (not shown) to form the bottom electrodes. Remove the portion of hardmask layer and ARC layer left uncovered by photoresist (ARC layer can optionally be left on as part of the hardmask). Remove the portion of bottom electrode layer 912 not covered by hardmask patterns. Remove the Ti—Al—N adhesion-promoting layer 910 from areas left uncovered by bottom electrodes 912. See FIG. 9e.

(f) Deposit an approximately 40 nm capacitor dielectric layer 914 of Ba$_{0.5}$Sr$_{0.5}$TiO$_3$ at about 500° C. using a technique such as RF magnetron sputtering. Then deposit an approximately 100 nm platinum top electrode field plate 916. Deposit a (Ti$_{0.75}$Al$_{0.25}$)—N covering and hardmask layer 918 of approximately 25 nm thickness over the platinum top electrode 916. Deposit an ARC layer (not shown) comprising Si—O—N or an organic layer, for example. Deposit and pattern photoresist (not shown) to define the boundaries of the top electrode field plate. Remove the uncovered portions of Ti—Al—N layer 918. Remove the ARC layer and photoresist (ARC layer can optionally be left on as a part of the hardmask). Then, using the remaining Ti—Al—N as a hardmask, remove the exposed portion of top electrode field plate 916 and the underlying BST 914. See FIG. 9f.

(g) Deposit and planarize a 500 nm thick interlayer dielectric 920 (e.g. PETEOS) over the structure. Etch bitline contact vias 922 to the drains 924 of the transistors. See FIG. 9h.

(h) Deposit titanium and use silicidation process described above in step (c) to form silicide (not shown) at transistor drains 924. Deposit a thin contact hole liner 923, preferably of $SiO_2$ and by a conformal CVD process, followed by a planar etch to remove the deposited dielectric on the drains of the transistors. See FIG. 9h.

(i) Deposit bitline conductor 926 such as tungsten or polysilicon to contact drains 924 and form the bitline. See FIG. 9i.

Etch Processes

The etching of the platinum electrodes is one of the most challenging steps in the process. Platinum as a noble metal, its oxides, and platinum-halogen compounds, all have very low volatility at moderate temperatures such as are used in dry etch processes. Platinum etch processes are predominantly physical, as opposed to chemical, etches. This results in low etch rate, low etch selectivity to resist and oxide/nitride, and more importantly in the formation of transient sidewall fences due to platinum redeposition during etching. The combination of low platinum etch rate and poor selectivity to resist and oxide/nitride implies a large resist budget (a thick layer of resist is needed because it is etched more quickly than the underlying material).

A silicon oxide (or nitride) layer of a few hundred nanometers can be used as a hardmask for the platinum bottom electrode etch. The selectivity of $Pt:SiO_2$ or $Pt:SiN_x$ is typically between 2 to 3. The subsequent removal of the hardmask by either dry or wet etch processes after Pt etch will result in excessive field oxide loss due to the poor selectivity between the field oxide and the hardmasks. The dry etching of SiO2 and SiNx is performed with fluorine-based etch chemistries. It is undesirable to use both fluorine and chorine etches in the same etch chamber, so the fluorine process is incompatible with the chlorine-based platinum etch. Hence, a hardmask material that is removable with a chlorine-based etch is preferable.

Ti—Al—N is a preferred choice as a hardmask material for platinum electrodes for several reasons. First, Ti—Al—N etches easily in a chlorine-containing plasma ($Cl_2$, $Cl_2/Ar$, or $Cl_2/O_2$ with a small amount (e.g. less than about 15%) of $O_2$) with a relatively low bias power (e.g. less than about 500 W in the etcher used to produce the data in Table I). Thus, it is easily distinguished from platinum, which is typically removed with high bias power. Second, in an etch chemistry comprising oxygen, such as an $Ar/O_2$ plasma, $Ar/O_2/Cl_2$, or a $Cl_2/O_2$ plasma with a high $O_2$ concentration, Ti—Al—N etches very slowly. Indeed, the efficacy of Ti—Al—N as a hardmask layer depends upon the oxygen in the etch chemistry to combine with the aluminum in the hardmask layer to form aluminum oxide, which acts as a self-passivation layer for the hardmask. The preferred hardmask material, therefore, comprises at least 1% aluminum. Note that an upper limit to the concentration of aluminum in Ti—Al—N applies to hardmask layers that remain on the structure as conductive elements, such as the via etch stop layer discussed below. See step (g) of the embodiment process described above for alternative hardmask materials.

The same reasoning applies to an etch stop layer, such as the adhesion-promoting layer in the above embodiments that is used to stop the platinum etch from reaching the underlying interlayer dielectric. In addition to protecting the interlayer dielectric in general, the adhesion-promoting layer described above also reduces microtrenching at the foot of the platinum electrode caused by reflected ions off the sloped sidewall. This is also helpful in preventing plug loss in the event of misalignment between the poly plug and the bottom electrode.

Via Etch Stop Layer

Due to decreased via size and increased aspect ratio of vias in modern devices, a long overetch step is often used to form vias, particularly in some DRAM applications where the via depths to the capacitor top electrode field plate and to the periphery transistors could differ by more than 500 nm. TiN may be used as the via etch stop and ARC layer over the interconnect conductor or the top electrode in memory cells, but its etch selectivity to oxide is only 30:1. Such selectivity is insufficient for the long overetches and for the thin ARC layers that are often desired.

It has been discovered that alternatives to TiN offer superior etch selectivity to both oxide and nitride. Layers 840, 853, and 855 in the embodiments described above may be 1) Ti—Al, Ti—Al—N, Ta—Al, Al—N, or 2) Ti—Al/Ti—N, Ti—Al—N/Ti—N, Ta—Al/Ti—N, Ti—Al/Ti—Al—N and other similar combinations (with or without Ti—N) to form bi-layers, or 3) combinations of the above to form tri-layers. The preferred material is $(Ti_{1-x}Al_x)$—N, where x is the aluminum concentration and is in the range of approximately 0.01 to 0.60. The upper limit on aluminum content is driven primarily by the conductivity of the material (in Ti—Al—N, the resistivity of the material increases with the aluminum content). Since the via etch stop material forms the contact between the underlying conductor (such as top electrode 838 in FIG. 8n) and the upper conductor (such as first metal layer 852 in FIG. 8n) it is desirable that it have a high conductivity. The minimum aluminum concentration is primarily driven by the need to form a sufficient self-passivation aluminum oxide layer to enhance the etch selectivity, and in a particular case, by the need for oxidation resistance when the etch stop layer is covering the top electrode of memory cell capacitors.

Using an $Ar/CF_4/CHF_3$ etch chemistry produces etch selectivities as follows: oxide:TiN 28.4:1; oxide $Ti_{0.75}Al_{0.25}N$ 48.2:1; and oxide:$TiAl_3$ 228:1. The etch conditions are the following: pressure is 250 mTorr, RF bias power is 800 W, Ar flow rate is 200 sccm, $CF_4$ flow rate is 70 sccm, $CHF_3$ flow rate is 35 sccm. Similar results are produced with a nitride etch using an $Ar/CF_4/O_2$ etch chemistry. The nitride selectivities are as follows: nitride:TiN 12.9:1, nitride:$Ti_{0.75}Al_{0.25}N$ 30.3:1, and nitride:$TiAl_3$ 39.5:1. The silicon nitride etch is performed with an $Ar/CF_4/O_2$ etch using the following conditions: pressure is 250 mTorr, RF bias power is 800 W, Ar flow rate is 200 sccm, $CF_4$ flow rate is 70 sccm, and $O_2$ flow rate is 25 sccm. Note that similar etch selectivities are expected in high-density plasma etchers. Alternative etch chemistries can include $CF_4$, $CHF_3$, $CH_2F_2$, $CH_3F$, $O_2$, Ar, $SF_6$, $C_2F_6$, $C_4F_8$, $C_3F_6$, and other fluorinated or perfluorinated hydrocarbons. One or more gases can be used, with at least one being fluorine-based.

The use of the materials described above increases the oxide etch selectivity to the via etch stop layer, which makes longer over etch possible without punching through the via etch stop layer (e.g. layer 840 in FIG. 8n). In DRAM applications, the higher oxide etch selectivity to the electrode will lessen the risk of depletion of the electrode at the bottom of vias. Such depletion could cause increased contact resistance or even device failure. If the bi-layer or tri-layer structures are used, the thickness of the layers may be optimized to give less reflectance at the metal patterning step. As indicated above, the same advantages could be achieved when etching through silicon nitride to such a via etch stop layer.

It should be noted that the via etch stop and hardmask features of the materials described above may be applied to devices other than memory circuits. Indeed, in any situation where one layer (of metal, for example) is to be connected to an adjacent layer, the via etch stop materials described above may be used. The materials described above are particularly useful when one layer is to be coupled through vias to underlying layers that lie at different distances from the overlying layers, thus requiring a long overetch of one via to allow time for the completion of the deeper via. Virtually any type of semiconductor device such as microprocessors, digital signal processors, memory circuits, and so forth may benefit from such an etch stop layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the embodiment memory circuits described herein could be embedded on an integrated circuit with a processor such as a microprocessor or digital signal processor. It is therefore intended that the appended claims encompass any such modifications or embodiments.

What is claimed is:

1. A method for fabricating an integrated circuit including a plurality of metal layers separated by dielectric layers, said method comprising the steps of:
   (a) forming a first conductive layer;
   (b) covering said first conductive layer with a conductive etchstop layer;
   (c) patterning and etching said etchstop layer in a desired pattern;
   (d) removing portions of said first metal layer not covered by said patterned etchstop layer;
   (e) depositing an interlevel dielectric layer on said etchstop layer plus first conductive layer;
   (f) etching a portion of said interlevel dielectric layer above said etchstop layer plus first conductive layer with an etchant that removes said interlevel dielectric layer at least thirty times faster than said etchstop layer to form a via through said interlevel dielectric layer having a bottom on said etchstop layer; and
   (g) filling said via with a second conductive layer.

2. The method of claim 1, wherein said conductive etchstop layer of step (b) of claim 1 is a material selected from the group consisting of Ti—Al, Ti—Al—N, Ta—Al, Al—N, Ti—Al/Ti—N, Ti—Al—N/Ti—N, Ta—Al/Ti—N, and Ti—Al/Ti—Al—N.

3. The method of claim 2, wherein said material is Ti—Al—N.

4. The method of claim 3, wherein said Ti—Al—N is $(Ti_{1-x}Al_x)$—N, where x is in the range of approximately 0.01 to 0.60.

5. The method of claim 2, wherein said material is Ti—Al.

6. The method of claim 5, wherein said material is $TiAl_3$.

7. The method of claim 1, wherein the etchant of step (f) of claim 1 is a fluorine-bearing etchant.

8. The method of claim 7, wherein said interlevel dielectric is silicon dioxide and said fluorine-bearing etchant is $Ar/CF_4/CHF_3$.

9. The method of claim 7, wherein said interlevel dielectric is silicon nitride and said fluorine-bearing etchant is $Ar/CF_4/O_2$.

10. A high-selectivity via etching process, comprising the steps of:
    (a) forming an etchstop layer of a material selected from the group consisting of Ti—Al, Ti—Al—N, Ta—Al, Al—N, Ti—Al/Ti—N, Ti—Al—N/Ti—N, Ta—Al/Ti—N, and Ti—Al/Ti—Al—N;
    (b) forming a dielectric layer over said etchstop layer; and
    (c) etching said dielectric layer with a fluorine-bearing etchant.

11. The method of claim 10, wherein said material is Ti—Al—N.

12. The method of claim 11, wherein said Ti—Al—N is $(Ti_{1-x}Al_x)$—N, where x is in the range of approximately 0.01 to 0.60.

13. The method of claim 11, wherein said material is Ti—Al.

14. The method of claim 13, wherein said material is $TiAl_3$.

15. The method of claim 10, wherein said dielectric layer is silicon dioxide and said fluorine-bearing etchant is $Ar/CF_4/CHF_3$.

16. The method of claim 10, wherein said dielectric layer is silicon nitride and said fluorine-bearing etchant is $Ar/CF_4/O_2$.

* * * * *